United States Patent [19]
Griffith

[11] Patent Number: 5,097,387
[45] Date of Patent: Mar. 17, 1992

[54] CIRCUIT CHIP PACKAGE EMPLOYING LOW MELTING POINT SOLDER FOR HEAT TRANSFER

[75] Inventor: James L. Griffith, Holden, Mass.

[73] Assignee: Digital Equipment Corporation, Maynard, Mass.

[21] Appl. No.: 544,613

[22] Filed: Jun. 27, 1990

[51] Int. Cl.⁵ .............................................. H05K 7/20
[52] U.S. Cl. .................................. 361/385; 165/80.4; 165/185; 174/15.2; 357/81; 361/388
[58] Field of Search ...................... 165/80.3, 80.4, 185; 357/81, 79; 174/16.3, 15.2; 361/385–389

[56] References Cited

U.S. PATENT DOCUMENTS

| 4,092,697 | 5/1978 | Spaight | 361/387 |
| 4,546,409 | 10/1985 | Yoshino et al. | |
| 4,612,601 | 9/1986 | Watari | 361/387 |
| 4,727,221 | 2/1988 | Saitou et al. | |
| 4,742,024 | 5/1988 | Sugimoto et al. | |
| 4,812,896 | 3/1989 | Rothgery et al. | |
| 4,879,632 | 11/1989 | Yamamoto et al. | 361/386 |
| 4,940,085 | 7/1910 | Nelson et al. | 361/385 |

OTHER PUBLICATIONS

Chu, "Conduction Cooling", IBM Technical Disclosure Bulletin, vol. 21, No. 2, 7/78, p. 751.
Coughlin et al., "Thermally Enhanced Semiconductor Chip Packaging Structure", IBM Technical Disclosure Bulletin, vol. 21, No. 1, 6/78, p. 185.

Primary Examiner—Gregory D. Thompson
Attorney, Agent, or Firm—Jones, Tullar & Cooper

[57] ABSTRACT

A circuit chip package and method for assembling the same is disclosed which employs low eutectic or melting point solder, such as an indium alloy, as a thermally conductive medium between each circuit chip and the package cover. The melting point of the solder is selected above the highest normal operating temperature of the chips but below a temperature which would damage the chips or their interconnects. To assemble the package, the housing cover, which has one or more solder receptacles formed therein, is inverted and partially filled with liquid solder. A base containing the circuit chips and interconnects is then attached to the cover so that the top portions of the chips or extensions on the chips are partially dipped into the solder. The solder is then allowed to cool and solidify and thereby automaticaly accommodates for chip to housing dimensional variations. The package can be easily disassembled by passing warm fluid over the package to cause the solder to reliquify.

19 Claims, 3 Drawing Sheets

CIRCUIT CHIP PACKAGE EMPLOYING LOW MELTING POINT SOLDER FOR HEAT TRANSFER

BACKGROUND OF THE INVENTION

The present invention relates in general to a circuit chip package which employs low melting point solder to transfer heat away from circuit chips, and a method for assembling the same.

Multi-chip Units, otherwise known as MCUs, are circuit modules using interconnect mediums, such as metal/ceramic, copper/polymide or copper/FR4, which house several microchips and are used extensively in computers. The MCU protects the chips from the environment and heat, and also supports the chips' needs for power and signal interconnections between other chips within the MCU or other MCUs elsewhere in the computer.

Numerous techniques have been employed in the past to direct heat away from the chips in an MCU so that they are maintained within a permissible range of operating temperatures. One prior technique known as bottom side cooling employs heat removal structures which contact the bottom sides of the chips and remove heat through the MCU base. A drawback to this technique is that the heat removal structures take up space in the MCU base which interferes with the signal and power interconnects and prevents high density chip packing configurations.

An alternative to bottom side cooling which avoids this drawback is called top side cooling in which heat is removed from the sides of the chips opposite to their bottom interconnect sides. Top side cooling techniques typically employ fluid cooling wherein a gas or liquid is caused to flow over the exterior portions of the chip to draw away heat. In MCUs, a plurality of circuit chips are packaged within a protective housing and direct fluid cooling of the chips is difficult since cooling fluid cannot be passed through the MCU housing without specific structural modifications. A known solution to this problem is to couple each of the circuit chips thermally to the MCU housing so that the heat generated by the chips is transferred to the housing which can be cooled using any suitable technique. However, it is difficult to connect each of the circuit chips rigidly to the MCU housing because some way must be provided to accommodate minute dimensional differentials between each of the like circuit chips and the housing. It is also highly desirable to accommodate the more significant dimensional differentials between dissimilar chips and microassemblies. To remedy this, spring elements have been employed which attempt to provide good thermal contact between each of the circuit chips and the MCU housing while accommodating for chip to housing dimensional variances. However, since the spring elements are inherently flexible, they may be subjected to motion which could impair thermal contact quality. Also this technique becomes costly and laborsome for situations having significant height differentials between chips or microassemblies due to the different springs or parts required.

In view of the foregoing, what is needed is a technique for thermally connecting circuit chips to a MCU housing which provides a good thermal path between the chips and the housing that accommodates for chip to housing dimensional variances without requiring complicated arrangements of mechanical parts that would impair the assembly process, and without interfering with the power and circuit interconnections.

SUMMARY OF THE INVENTION

To satisfy the foregoing need, the present invention provides a MCU package and method for assembling the same which employs a block of low melting temperature material, such as low eutectic solder, as a thermal transfer material between each of a plurality of circuit chips in the MCU and a combination cover and heat exchanger. The use of a low melting temperature material insures that the MCU package can be easily assembled and disassembled without exposing the chips or their interconnects to damaging heat. More specifically, the MCU package includes a base on which are mounted a plurality of circuit chips that are connected to an electrical substrate in the base. The cover/heat exchanger is attached to the base to form a hermetically sealed enclosure for the circuit chips. Contained within one or more receptacles in the cover is a solidified block of low eutectic or low melting temperature solder, such as an indium alloy. The solder intimately contacts the circuit chips, or thermally conductive extensions attached thereto, on their top and side surfaces, and acts as a thermal path between each of the circuit chips and the cover/heat exchanger During the assembly of the MCU package, the cover is held in an inverted position and the receptacles are partially filled with liquid low eutectic solder. The melting point of the solder is chosen around 60° to 200° C. so that it can be easily melted to facilitate this procedure. The base containing the circuit chips and associated interconnects is then inverted and attached to the cover/heat exchanger. In the process, the circuit chip housings or extensions are dipped partially into the liquid solder so that they are contacted by the solder on their top and side surfaces.

Once the base has been assembled to the MCU cover/heat exchanger, the solder is allowed to cool and solidify in intimate contact with each of the circuit chips or extensions, thus compensating for any dimensional variances or misalignments between each of the chips and the cover/heat exchanger. Once the solder has solidified, the MCU package can be oriented in any desired position. Heat generated by the circuit chips is then transferred through the solidified solder to the MCU cover/heat exchanger which includes any suitable heat radiating structures, such as heat pipes or fins.

If at some point it is desired to disassemble the MCU package, this can be easily accomplished by inverting the package and passing warm fluid through or over the heat radiating structure so that the low melting point solder will melt and permit separation of the MCU base from the cover/heat exchanger.

BRIEF DESCRIPTION OF THE DRAWINGS

The features and advantages of the present invention will become apparent from the following detailed description of preferred embodiments thereof, taken in conjunction with the accompanying drawings, in which.

DETAILED DESCRIPTION OF THE PREFERRED EMBODIMENT

Figure 1:
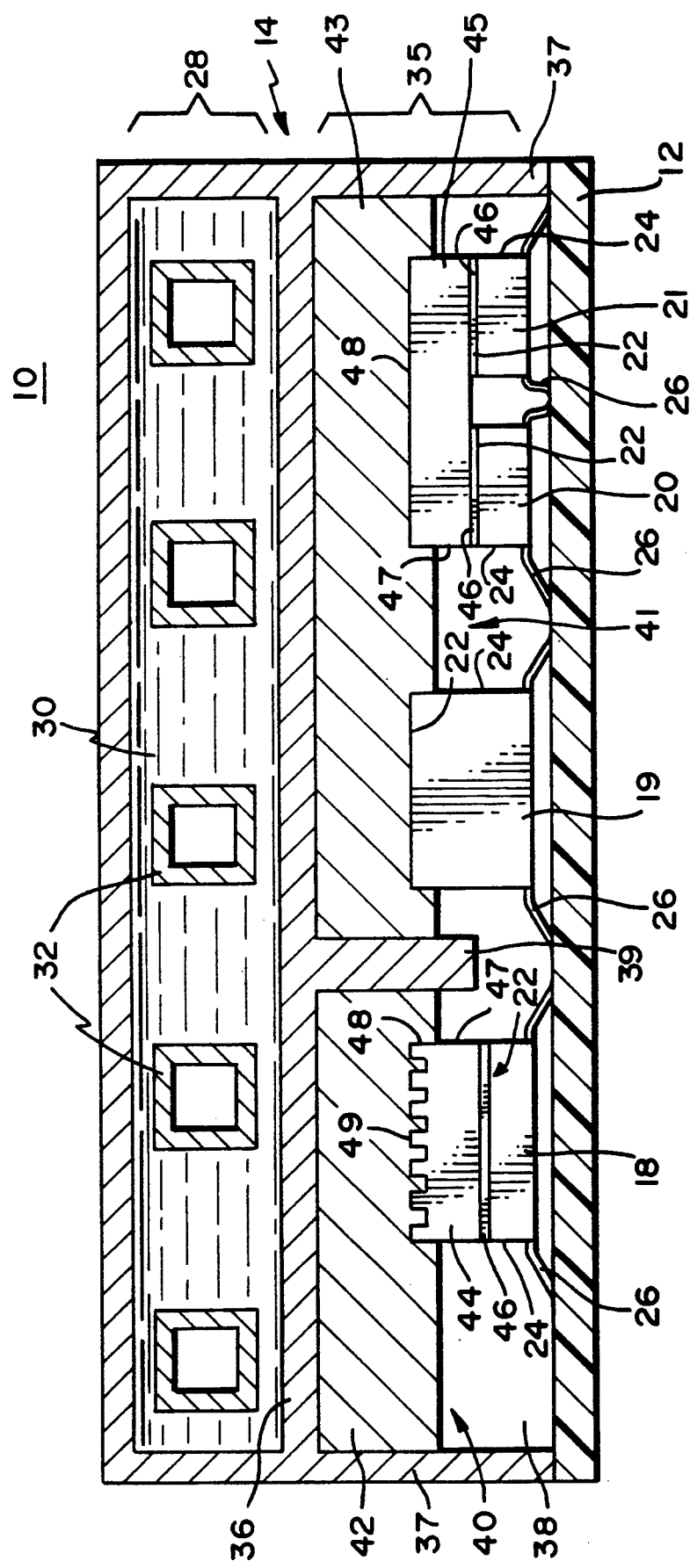
FIG. 1 is a cross-sectional front view of a MCU package constructed in accordance with the present invention.

Turning now to a more detailed consideration of the present invention, FIG. 1 illustrates an MCU package 10 which generally includes a base 12 and a combination cover/heat exchanger 14 attached thereto in any suitable manner, such as by conventional fasteners, adhesives or the like. The base 12 preferably contains a printed circuit board commonly known as a high density signal carrier (HDSC), and is a metal/ceramic, copper/polymide or copper/FR4 multi-layer panel which provides interconnects (not shown) for signals and power to be interconnected to a plurality of circuit chips 18, 19, 20 and 21 disposed thereon. It will be understood that any desired number of circuit chips can be disposed on the base 12, and four are shown in FIG. 1 for illustrative purposes only. Each of the circuit chips 18–21 has a top surface 22 and one or more side surfaces 24. A plurality of conventional TAB type lead frames 26 electrically connect each of the circuit chips to the interconnects in the base 12.

The cover/heat exchanger 14 is generally rectangular and includes an upper heat exchanger portion 28 which is illustrated as being a conventional heat pipe structure including a heat transfer fluid filled chamber 30, and a plurality of apertured pipes 32 through which is passed another cooling fluid, such as air, to remove heat from the heat transfer fluid. The cover/heat exchanger 14 also includes a lower cover portion 35 which is separated from the heat exchanger portion 28 by a horizontal dividing wall 36 that forms a top wall for the cover portion 35. The cover portion 35 also includes a plurality of depending side walls 37 which, in conjunction with the dividing wall 36, form a sealed enclosure 38 for the circuit chips 18–21 when the cover/heat exchanger 14 is attached to the base 12. It should be understood that although the cover/heat exchanger 14 is illustrated in FIG. 1 as being an integral structure, the heat exchanger portion 28 and cover portion 35 could be made of separate pieces, if desired, and bonded or connected together using any known technique.

A vertical dividing wall 39 depends part way toward the base 12 from the top wall 36 of the cover portion 35 which, with the sidewalls 37, forms first and second receptacles 40 and 41 in the cover portion 35 that receive first and second blocks of solidified low eutectic or low freezing temperature solder 42 and 43. The first solder block 42 directly contacts a thermally conductive extension 44 on the circuit chip 18, while the second solder block 43 contacts the circuit chip 19 and a thermally conductive extension 45 on the circuit chips 20 and 21, as will be described in greater detail below. The first receptacle 40 and first solder block 42 therefore form a thermal transfer path for the circuit chip 18, while the second receptacle 41 and second solder block 43 form a thermal path for the circuit chips 19, 20 and 21. Use of individual receptacles in the cover portion 35 for each circuit chip improves the thermal transfer from each chip to the heat exchanger portion 28, but is not required for operation of the invention.

The solder in the blocks 42 and 43 is highly thermally conductive and preferably has a melting point between 60° and 200° C., and by way of example can be chosen from a group of indium alloy solder formulations manufactured by The Indium Corporation, such as INDALLOY 18, INDALLOY 162, INDALLOY 8 and INDALLOY 1E. These particular formulations have melting points that range between 62 and 118° C., while their thermal conductivities range between 13.8 and 20.6 BTU/HR.−FT.−F°. The low melting point of the solder ensures that it can be melted for assembly and disassembly of the MCU package 10 without exposing the electrical interconnects in the base 12 or the circuit chips to excessive heat which could damage them. The melting point should, however, be higher than the highest operating temperature of the circuit chips to avoid localized melting of the solder during normal operation of the MCU.

The thermally conductive extensions 44 and 45 attached to the circuit chip 18 and chips 20 and 21, respectively, are preferably formed from a highly thermal conductive material, such as silicon carbide or silicon nitride. These extensions are attached to each of the chips 18, 20 and 21 by means of a thin layer 46 of thermally conductive adhesive, such as high temperature solder or, if it is desired that the chips be electrically insulated from the extensions, thermally conductive epoxy. If high temperature solder is employed, the extensions 44 and 45 are applied to the circuit chips 18, 20 and 21 before assembly of the chips to the base 12 so that the temperature sensitive interconnects in the base 12 will not be exposed to damaging heat.

Each of the extensions 44 and 45 include one or more side surfaces 47 and a top surface 48. The first extension 44 is illustrated as having a plurality of optional fins 49 formed in the top surface 48 which increase the surface area of the extension 44 that is in contact with the first solder block 42 to increase the heat transfer and also improve the adhesion characteristics between the two. The extension 45 does not employ any such fins, and is shown attached to both circuit chips 20 and 21 to act as a thermally conductive extension for each of these chips. It will be understood that a single thermally conductive extension, such as extension 45, could be used to transfer heat to the second solder block 43 from any number of circuit chips, or from a subassembly of circuit chips.

The circuit chip 19 is illustrated in FIG. 1 as not utilizing a heat transfer extension, but instead employs a taller construction so that the top and side surfaces 22 and 24 of the chip 19 contact the second solder block 43. The use of the extensions 44 and 45 is preferred over this alternative because the solder could wick up the side surfaces 24 of the circuit chip 19 during assembly or disassembly and cause a short circuit in the chip leads. Also, the use of extensions further helps accommodate dimensional variances between each of the chips and the solder blocks.

Preferably, the extensions 44 and 45 and chip 19 extend into the solder blocks 42 and 43 between 0.020 and 0.250 inches so that the side and top surfaces 47 and 48 of the extensions and chip are in thermal contact with the solder blocks 42 and 43 to increase heat transfer.

During operation of the MCU assembly 10, heat generated by the circuit chips 18–21 will be transferred through the solder blocks 42 and 43 to the cover/heat exchanger 14, and removed from the MCU assembly 10 by the heat transfer fluid in the chamber 30, and the air in the pipes 32.

Figure 2:
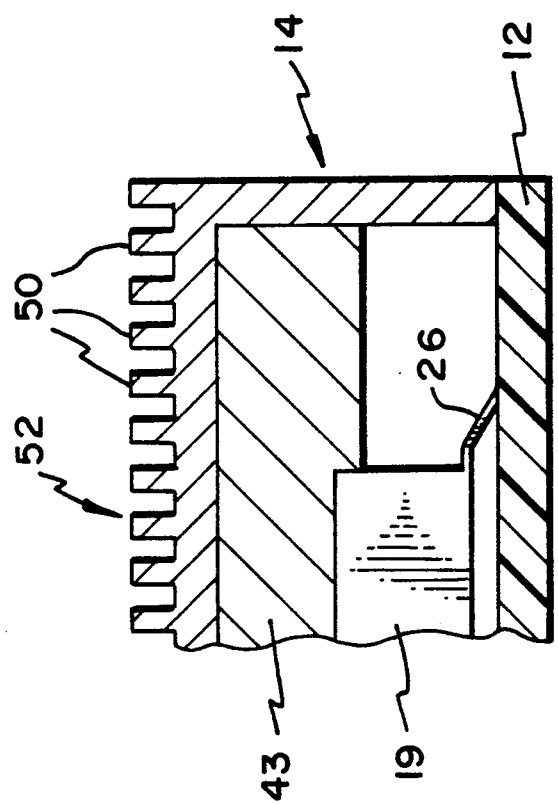
FIG. 2 is a cross-sectional partial front view of a modification to the embodiment of FIG. 1; and, FIG. 3 is a cross-sectional front view of a partially assembled MCU package illustrating a step in the assembly of the package in accordance with the present invention.

An alternative type of heat removal structure for the MCU package 10 is illustrated in FIG. 2 in which a plurality of fins 50 are formed integrally in a top side 52 of the cover/heat exchanger 14 for conventional radiative cooling. It will be understood that any other suitable type of heat removal structure or technique can also be employed to remove the heat from the MCU package 10.

Figure 3:
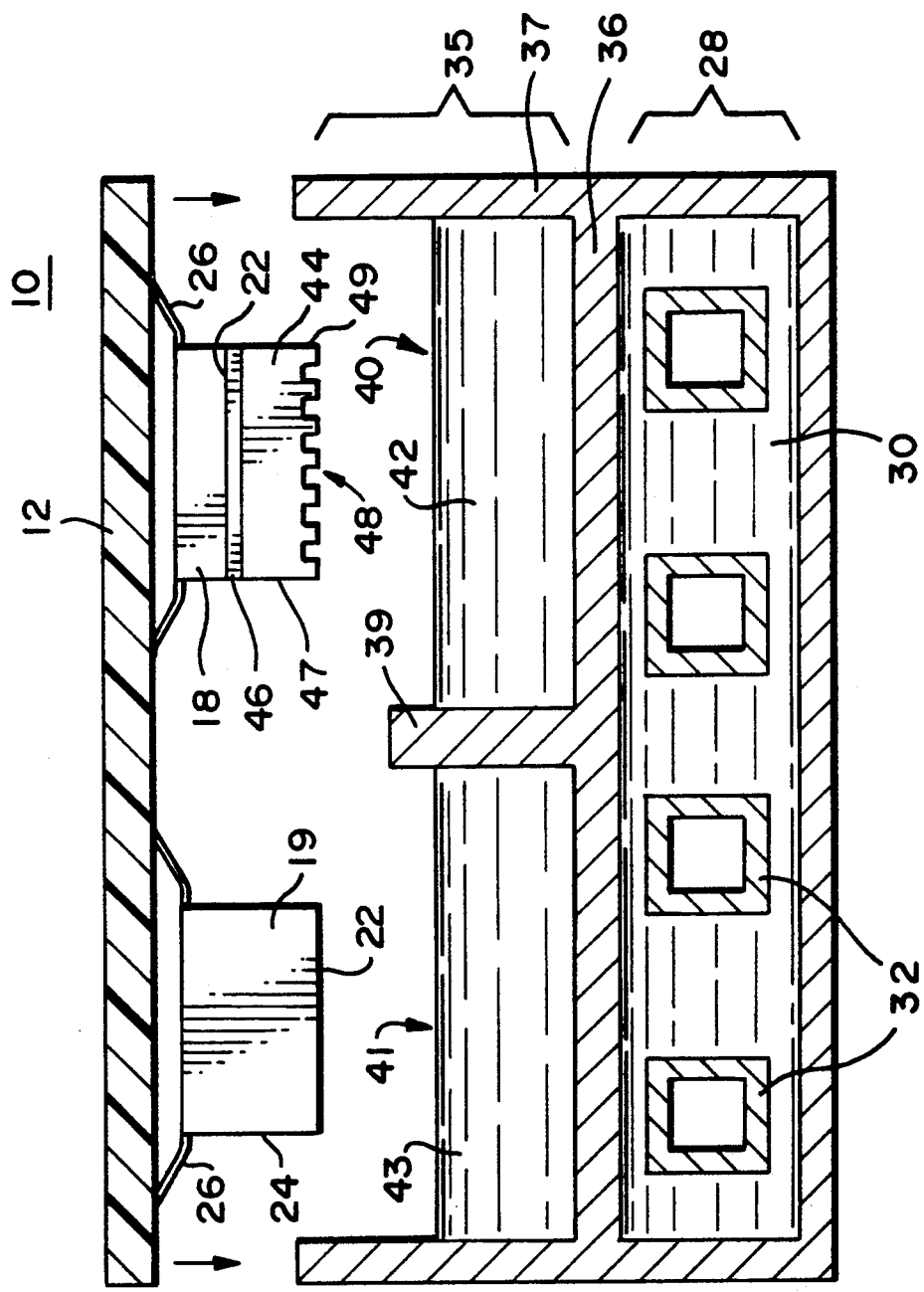

Turning now to FIG. 3, the assembly/disassembly process for the MCU package 10 is illustrated. For convenience, the MCU assembly 10 in FIG. 3 is illustrated as only containing the circuit chips 18 and 19. To assemble the MCU package 10, the cover/heat exchanger 14 is held in an inverted position and the receptacles 40 and 41 are partially filled with pools of liquid solder 42 and 43. To maintain the solder in a liquid state, heated fluid can be passed through the chamber 30. The base 12 containing the circuit chips 18 and 19 is then attached to the cover/heat exchanger 14 using any suitable conventional bonding technique so that the top and side surfaces of the thermally conductive extension 44 and chip 19 are dipped into the solder pools 42 and 43. Finally, a cooling fluid is passed through the chamber 30 to cause the solder pools 42 and 43 to solidify and conform to the exact positioning of the extension 44 and circuit chip 19, thereby accommodating for any dimensional variances or misalignments. This procedure is reversed if it is necessary to disassemble the MCU package 10 for maintenance or repairs. In particular, the MCU package 10 is inverted and a warm fluid is passed through the chamber 30 to cause the solder to liquify so that the base 12 can be removed from the cover/heat exchanger 14.

The present invention therefore provides a circuit chip package in which the circuit chips are thermally coupled to an external heat radiating surface of the package through a rigid connection that accommodates chip to housing dimensional variances and misalignments, provides superior heat transfer and enables the package to be easily assembled and disassembled without undue risk of damage to the chips or associated circuits.

Although the invention has been disclosed in terms of preferred embodiments, it should be understood that numerous variations and modifications could be made thereto without departing from the true spirit and scope thereof as defined by the following claims.

I claim:

1. A package for circuit chips comprising:
   a) a base;
   b) at least a first circuit chip disposed on said base;
   c) a thermally conductive extension disposed on said circuit chip, said extension including a top surface having a plurality of fins;
   d) a cover attached to said base; and
   e) a low melting point thermally conductive material disposed in said cover between said extension and said cover, and contacting said extension and said cover, said low melting point thermally conductive material having a melting point above the operating temperature of said circuit chip.

2. The package of claim 1, wherein said low melting point thermally conducted material has a melting point between 60 and 200° C.

3. The package of claim 2, wherein said low melting point thermally conducted material is solder.

4. The package of claim 3, wherein said solder is formed from an indium alloy.

5. The package of claim 1, further including at least a first receptacle in said cover for receiving said low melting point thermally conductive material.

6. The package of claim 1, further comprising heat exchanger means disposed in said cover.

7. The package of claim 6, wherein heat exchanger means comprises a plurality of fins formed in a top wall of said cover.

8. The package of claim 6, wherein said heat exchanger means comprises a heat pipe structure disposed in said cover.

9. A package for circuit chips comprising:
   a) a base;
   b) at least first and second circuit chips mounted on said base; said circuit chips each including a top surface;
   c) first and second conductive extensions mounted, on each, on said top surfaces of said first and second circuit chips, said extensions each including top and side surfaces, wherein at lest one of said extensions includes a plurality of fins disposed on its top surface;
   d) a cover formed of thermally conductive material, said cover being attached to said base to form a sealed enclosure for said circuit chips; and,
   e) a block of solidified low melting temperature thermally conductive solder disposed in said cover, sad solder being in direct contact with said cover and said top and side surfaces of said extensions to draw heat away from said circuit chips to said cover.

10. The package of claim 9, wherein said low melting temperature solder has a melting point between 60 and 200° C.

11. The package of claim 10, wherein said solder is formed from an indium alloy.

12. The package of claim 9, further including heat exchanger means disposed in said cover.

13. The package of claim 12, wherein said heat exchanger means comprises a plurality of fins formed in a top wall of said cover.

14. The package of claim 12, wherein said heat exchanger means comprises a heat pipe structure disposed in said cover.

15. A package for circuit chips comprising:
   a) a base;
   b) at least first and second circuit chips mounted on said base, said circuit chips each including a top surface;
   c) first and second conductive extensions mounted, on each, on said top surfaces of said first and second circuit chips, said extensions each including top and side surfaces wherein at least one of said extensions includes a plurality of fins disposed on its top surface;
   d) a cover formed of thermally conductive material including at least first and second receptacles formed therein, said cover being attached to said base to form a sealed enclosure for said circuit chips; and
   e) first and second blocks of solidified low melting temperature thermally conductive solder disposed in said first and second receptacles, respectively, to draw heat away from said circuit chips to said cover, said first solder block being in direct contact with said cover nd said top and side surfaces of said first extension, and said second solder block being in direct contact with said cover and said top and side surfaces of said second extension.

16. The package of claim 15, wherein said low melting temperature solder has a melting temperature between 60° and 200° C.

17. The package of claim 16, wherein said low melting temperature solder is formed from an indium alloy.

18. The package of claim 15, wherein a plurality of heat exchanger fins are formed in the top wall of said cover.

19. The package of claim 15, wherein a heat pipe structure is disposed in said cover.

* * * * *

UNITED STATES PATENT AND TRADEMARK OFFICE
CERTIFICATE OF CORRECTION

PATENT NO. : 5,097,387
DATED : March 17, 1992
INVENTOR(S) : JAMES L. GRIFFITH

It is certified that error appears in the above-identified patent and that said Letters Patent is hereby corrected as shown below:

In claim 9, line 7 (column 6, line 18), "on each" should read --one each--;
line 16 (column 6, line 27), "sad" should read --said--.

In claim 15, line 7 (column 6, line 50), "on each" should read --one each--;
line 22, (column 6, line 65), "nd said to" should read --and said top--.

Signed and Sealed this

Fourth Day of May, 1993

Attest:

MICHAEL K. KIRK

Attesting Officer

Acting Commissioner of Patents and Trademarks